United States Patent
Ohashi

(10) Patent No.: US 10,165,720 B2
(45) Date of Patent: Dec. 25, 2018

(54) PRODUCTION OPTIMIZATION DEVICE OF COMPONENT MOUNTING LINE

(71) Applicant: FUJI CORPORATION, Chiryu (JP)

(72) Inventor: Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 293 days.

(21) Appl. No.: 14/911,379

(22) PCT Filed: Aug. 22, 2013

(86) PCT No.: PCT/JP2013/072460
§ 371 (c)(1),
(2) Date: Feb. 10, 2016

(87) PCT Pub. No.: WO2015/025408
PCT Pub. Date: Feb. 26, 2015

(65) Prior Publication Data
US 2016/0205822 A1 Jul. 14, 2016

(51) Int. Cl.
*G06F 19/00* (2018.01)
*H05K 13/08* (2006.01)
(Continued)

(52) U.S. Cl.
CPC ............ *H05K 13/08* (2013.01); *G05B 15/02* (2013.01); *G05B 19/4083* (2013.01);
(Continued)

(58) Field of Classification Search
CPC .... H05K 13/0404; H05K 13/08; G05B 15/02; G05B 19/4083; G06Q 10/04
(Continued)

(56) References Cited

U.S. PATENT DOCUMENTS

2005/0065620 A1 3/2005 Maenishi et al.
2006/0052893 A1 3/2006 Yamazaki et al.
(Continued)

FOREIGN PATENT DOCUMENTS

JP 2006-515118 5/2006
JP 2006-515118 A 5/2006
(Continued)

OTHER PUBLICATIONS

Office Action dated Jun. 2, 2017 in Japanese Patent Application No. 2015-532656.
(Continued)

*Primary Examiner* — Brook Kebede
(74) *Attorney, Agent, or Firm* — Oblon, McClelland, Maier & Neustadt, L.L.P.

(57) ABSTRACT

A production optimization device for a component mounting line executes, an intra present property optimization process of optimizing production of the component mounting line under conditions in which a selection range of members to use in the production is restricted to within a range of members actually owned by a user (present property), and a no-property-restriction optimization process of optimizing the production of the component mounting line under conditions in which restriction of the selection range of the members to use in the production is removed for at least a subset of the members are executed, and optimization results of the intra present property optimization process are displayed on a display device compared to optimization results of the no-property-restriction optimization process.

9 Claims, 4 Drawing Sheets

(51) Int. Cl.
*G05B 15/02* (2006.01)
*G05B 19/408* (2006.01)
*H05K 13/04* (2006.01)
*G06Q 10/04* (2012.01)

(52) U.S. Cl.
CPC ......... *G06Q 10/04* (2013.01); *H05K 13/0404* (2013.01); *G05B 2219/32015* (2013.01)

(58) Field of Classification Search
USPC .......................................................... 700/97
See application file for complete search history.

(56) References Cited

U.S. PATENT DOCUMENTS

| | | | |
|---|---|---|---|
| 2007/0204086 A1 | 8/2007 | Jaroszewski et al. | |
| 2012/0110540 A1* | 5/2012 | Su | G06F 17/5036 716/132 |
| 2012/0136598 A1* | 5/2012 | Dmitriev-Zdorov | G06F 17/5063 702/65 |

FOREIGN PATENT DOCUMENTS

| | | |
|---|---|---|
| JP | 2009-129063 A | 6/2009 |
| JP | 2012-028660 A | 2/2012 |
| JP | 2012-243894 A | 12/2012 |
| JP | 2012243894 A * | 12/2012 |
| WO | WO 2004/066702 A1 | 8/2004 |

OTHER PUBLICATIONS

International Search Report dated Sep. 24, 2013, in PCT/JP2013/072460 filed Aug. 22, 2013.
Chinese Office Action dated Mar. 26, 2018 in Patent Application No. 201380078988.7 (Submitting English translation only), citing documents AA and AB therein, 5 pages.

* cited by examiner

[Fig.1]
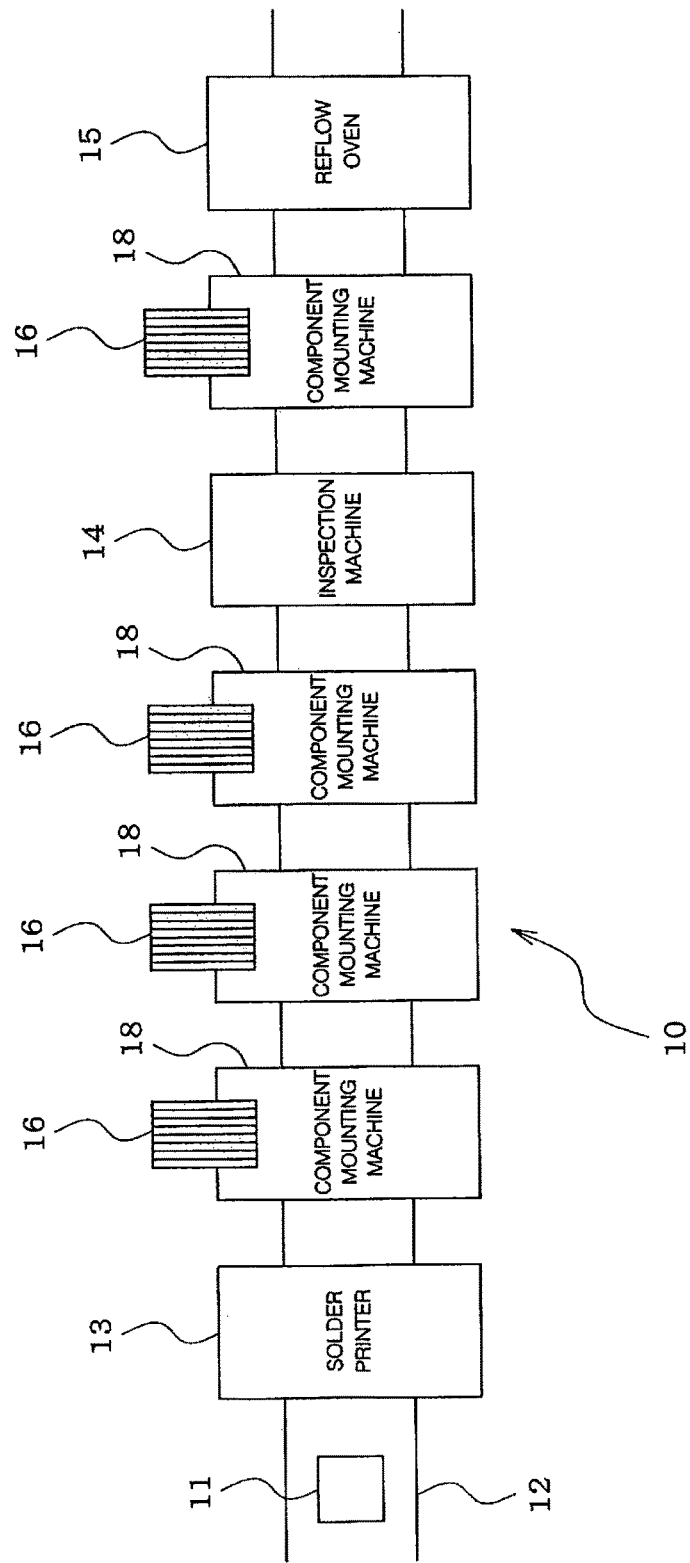

[Fig.2]
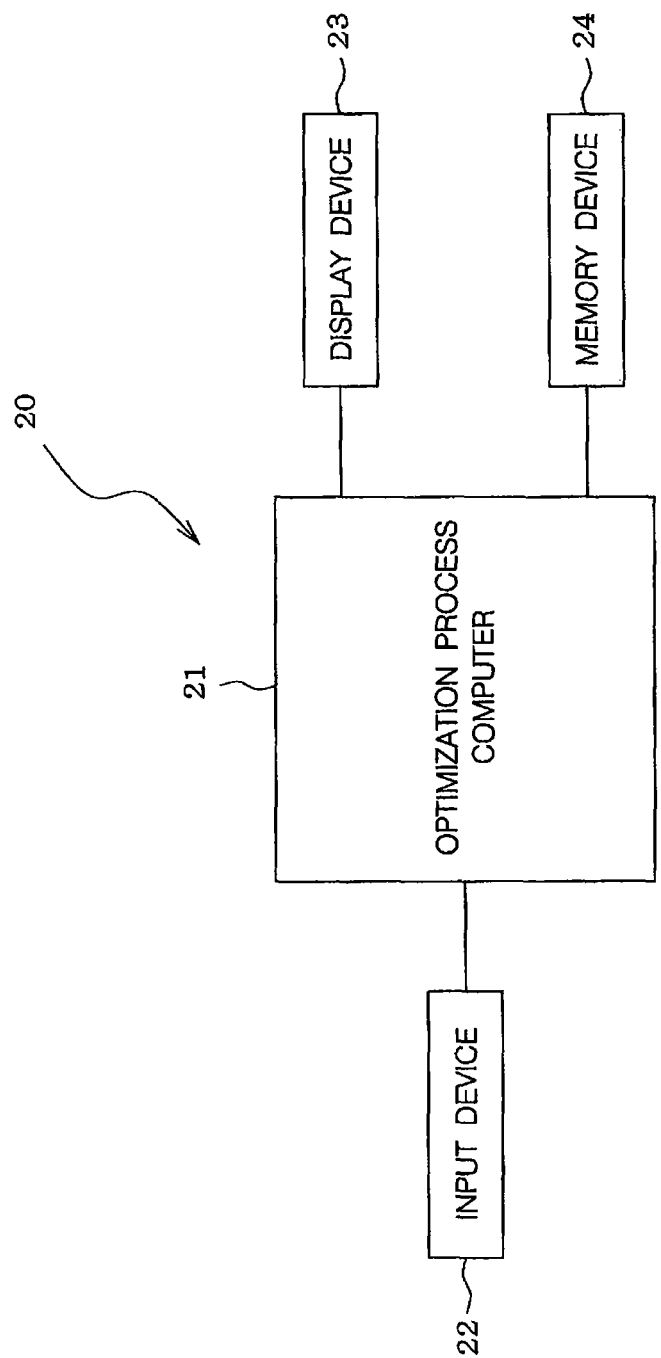

[Fig.3]
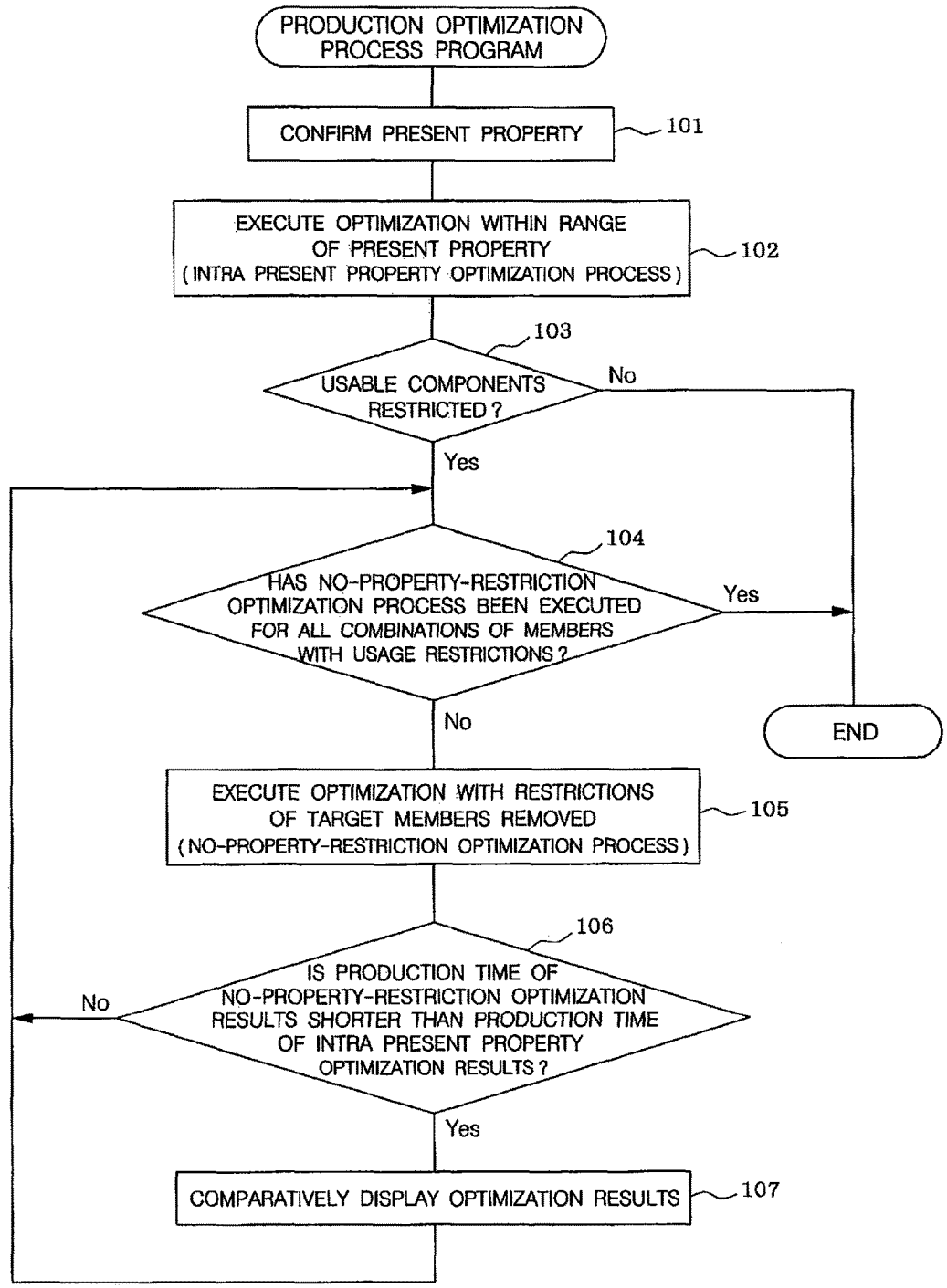

[Fig.4]

| | INTRA PRESENT PROPERTY OPTIMIZATION RESULTS | NO-PROPERTY-RESTRICTION OPTIMIZATION RESULTS (1) | NO-PROPERTY-RESTRICTION OPTIMIZATION RESULTS (2) |
|---|---|---|---|
| TOTAL PRODUCTION TIME INCREASE/DECREASE EFFECT | — | -1 HOUR | -2 HOURS |
| TOTAL PRODUCTION TIME | 10 HOURS | 9 HOURS | 8 HOURS |
| CYCLE TIME | 30.00 [s] | 20.00 [s] | 30.00 [s] |
| NUMBER OF SET-UP CHANGES | 3 TIMES | 3 TIMES | 1 TIME |
| TOTAL SET-UP CHANGING TIME | 3 HOURS | 3 HOURS | 1 HOUR |
| ADDITIONAL MEMBERS | NONE | NUMBER OF ADDITIONAL PD1 TAPE REELS : 10 | FEEDER A : 10<br>FEEDER B : 10<br>FEEDER C : 5 |

23

PRODUCTION OPTIMIZATION DEVICE OF COMPONENT MOUNTING LINE

TECHNICAL FIELD

The present disclosure relates to a production optimization device of a component mounting line in which components are mounted on a circuit board by a component mounting machine.

BACKGROUND ART

As a production optimization device of a component mounting line of the related art, as described in PTL 1 (JP-A-2012-243894), there is a device with the object of optimizing the balance of a component mounting line so as to reduce the total line cycle time when executing a plurality of production jobs using a single component mounting line, in which the device sets the cycle time of a bottleneck mounting machine among a plurality of mounting machines and the cycle time of a mounting related device for every production job, compares the cycle time of the bottleneck mounting machine and the cycle time of the mounting related device and sets the longer cycle time as a line cycle time of each production job for every production job, obtains a total line cycle time which is the effective total production time of the plurality of production jobs by adding together the line cycle times of the plurality of production jobs, and changes the component mounting order of each production job by switching a subset of the feeders of the plurality of mounting machines between the mounting machines such that the total line cycle time is shortened, and thus, optimizes the cycle time of the bottleneck mounting machine of each production job.

As described in PTL 2 (JP-A-2012-28660), a process of calculating the cycle time of each mounting machine of the component mounting line, a process of predicting a time band (a component depletion notification time band) for which component depletion of each feeder mounted to each mounting machine is notified, and a process of allocating, with priority, a worker that performs component replenishing work in the component depletion notification time band of each predicted mounting machine to a bottleneck mounting machine which is the mounting machine with the longest cycle time are executed, and, in order from the mounting machine with the smallest difference in cycle time from that of the bottleneck mounting machine, the allocation of the component replenishing work time band and the worker to the component depletion notification time band is performed.

CITATION LIST

Patent Literature

PTL 1: JP-A-2012-243894
PTL 2: JP-A-2012-28660

BRIEF SUMMARY

Problem to be Solved

Generally, when optimizing the production of a component mounting line (for example, the arrangement of the component mounting machines, the arrangement of the feeders of each of the component mounting machines, the number of tape reels that supply the same components, the arrangement of the suction nozzles, and the like), the optimization is performed by selecting the members to use in the production within the range of members actually owned by the user (for example, within ranges of the number of owned component mounting machines, the number of owned feeders, the number of owned tape reels, the number of owned suction nozzles, the number of owned exchangeable mounting heads, and the like). Regarding this point, although not clearly mentioned in PTL 1 or 2 described above, it is thought that in both cases, by the common technical knowledge of the time of the applications, the production of the component mounting line is optimized under conditions in which the selection range of members to use in the production is restricted to within the range of members actually owned by the user (present property).

However, for example, when the number of feeders is increased to more than the number actually owned, the replenishing of additional components may become unnecessary, changes in the set-up may become unnecessary, and, when the number of tape reels that supply the same components is increased to more than the number actually owned, the cycle times may be balanced, and the like, and there are cases in which further efficiency improvements can be obtained by increasing the number of members owned by the user. In the related art, in order to realize such efficiency improvements, it is necessary for a worker to change the settings of the owned members and search for appropriate settings of the members achieving both inexpensive investment costs and productivity by trial and error, and this work takes an extreme amount of labor.

Therefore, an object of the disclosure is to provide a production optimization device of a component mounting line which simplifies the work of searching for appropriate settings of members achieving both inexpensive investment cost and productivity.

Means for Solving the Problem

In order to solve the problems described above, the disclosure provides a production optimization device of a component mounting line in which components are mounted on a circuit board using component mounting machines, including intra present property optimization device for optimizing production of the component mounting line under conditions in which a selection range of members to use in the production is restricted to within a range of members actually owned by a user (a producer), no-property-restriction optimization device for optimizing the production of the component mounting line under conditions in which restriction of the selection range of the members to use in the production is removed for at least a subset of the members, and display device for displaying optimization results of the intra present property optimization device and optimization results of the no-property-restriction optimization device.

In this configuration, the optimization results of the intra present property optimization device for optimizing the production of the component mounting line under conditions in which the selection range of the members to use in the production is restricted to within the range of members owned by the user (present property), and the optimization results of the no-property-restriction optimization device for optimizing the production of the component mounting line under conditions in which the restrictions of the selection range of the members to use in the production are removed for at least a subset of the members are displayed on the display device, and thus, the worker can easily evaluate the investment cost and the productivity by comparing the optimization results of the intra present property device and the optimization results of the no-property-restriction optimization device which are displayed on the display device, and it is possible to simplify the work of searching for settings of the members achieving both inexpensive investment cost and productivity.

In this case, the no-property-restriction optimization device may obtain a plurality of the optimization results by executing a plurality of optimization processes under a plurality of different conditions. By doing so, it is possible to efficiently perform the work of searching for the optimum settings of the members achieving both inexpensive investment cost and productivity.

The display device may display at least one of a total production time, a cycle time, a number of set-up changes, and a total set-up changing time, respectively, as the optimization results of the intra present property optimization device and the optimization results of the no-property-restriction optimization device. Any of the total production time, the cycle time, the number of set-up changes, and the total set-up changing time serves as an index for evaluating the productivity.

The display device may display names and quantities of members which need to be added to the owned members as the optimization results of the no-property-restriction optimization device. Accordingly, it is possible to easily estimate the additional investment cost.

The display device may display a cost reduction effect due to the optimization as the optimization results of the no-property-restriction optimization device. Accordingly, it becomes possible to ascertain the cost reduction effect due to the optimization at a glance.

The members to use in the production may be at least one of a feeder, a suction nozzle, a batch set-up changing wheeled table, a tape reel, a component mounting machine, and a mounting head. The restriction of the selection range of the members to use in the production may be restricted by the quantities of the members. Alternatively, the selection range of the feeders is not limited to selection of only the quantity of the tape feeders, and it may be possible to select both the types and the quantities of the feeders from among plural types of feeder (for example, a tape feeder, a bulk feeder, a stick feeder, a tray feeder, and the like). In a similar manner, the selection range of the suction nozzles is not limited to the selection of only the quantity of suction nozzles, for example, it may be possible to select both the types and the quantities of the suction nozzle from among plural types of suction nozzle with different nozzle diameters and suction pad shapes.

BRIEF DESCRIPTION OF DRAWINGS

FIG. 1 is a block diagram illustrating the configuration of a component mounting line of an example of the disclosure.

FIG. 2 is a block diagram illustrating the configuration of a production optimization device.

FIG. 3 is a flowchart illustrating the flow of processes of a production optimization process program.

FIG. 4 is a diagram illustrating a display example of optimization results.

DESCRIPTION OF EMBODIMENTS

Hereinafter, description will be given of an example which embodies a mode for carrying out the disclosure.

First, description will be given of the configuration of a component mounting line 10 based on FIG. 1.

A plurality of component mounting machines 18 which mount components on a circuit board 11, and a plurality of mounting related devices which perform work relating to the component mounting are lined up on a conveyance path 12 which transports the circuit board 11. Here, the plurality of mounting related devices is, for example, a solder printer 13, a inspection machine 14, a reflow oven 15, an adhesive application device, and the like.

Feeders 16 such as tape feeders which supply components are set on each corresponding component mounting machine 18 in an exchangeable manner (a replaceable manner). Although not depicted in the drawings, the mounting head of each of the component mounting machines 18 is held in an exchangeable manner (a replaceable manner), and one or a plurality of suction nozzles which suck components that are supplied from the feeders 16 and mount the components on the circuit board 11 are held in an exchangeable manner (a replaceable manner) in the mounting head. The suction nozzles to be held in the mounting heads of each of the component mounting machines 18 are replaced from among plural types of suction nozzle which have different nozzle diameters, suction pad shapes, and the like according to the size, type, and the like of the components which are supplied by the feeders 16. In the component mounting line 10 which is configured in the manner described above, a component mounted board is produced by executing a production job (a production program).

Next, description will be given of the configuration of a production optimization device 20 based on FIG. 2. The production optimization device 20 is formed of an optimization process computer 21, an input device 22 such as a keyboard, a mouse, and a touch panel, a display device 23 (display device) such as a liquid crystal display panel or a CRT which displays optimization results and various information of FIG. 4 which is described later, and a memory device 24 in which various programs and data such as a production optimization process program of FIG. 3 which is described later are stored.

By executing the production optimization process program of FIG. 3 which is described later, the optimization process computer 21 functions as intra present property optimization device for optimizing the production of the component mounting line 10 using an intra present property optimization process under conditions in which the selection range of the members to use in the production is restricted to within the range of members (present property) actually owned by the user (the producer), also functions as no-property-restriction optimization device for optimizing the production of the component mounting line 10 using a no-property-restriction optimization process under conditions in which the restriction of the selection range of the members to use in the production is removed for at least a subset of the members, and, as illustrated in FIG. 4, displays the optimization results of the intra present property optimization process (intra present property optimization results) on the display device 23 compared to the optimization results of the no-property-restriction optimization process (no-property-restriction optimization results).

In the no-property-restriction optimization process of the present example, a plurality of optimization results is obtained by executing a plurality of optimization processes under a plurality of different conditions in which the restrictions of the selection range of the members to use in the production are removed. In the display example of FIG. 4, two sets of no-property-restriction optimization results (1)

and (2) which are obtained by the no-property-restriction optimization process are displayed compared to the intra present property optimization results.

As the intra present property optimization results and the no-property-restriction optimization results (1) and (2), the total production time, the cycle time, the number of set-up changes, and the total set-up changing time are displayed, and further, for the no-property-restriction optimization results (1) and (2), the total production time increase/decrease effect, and the names and quantities of members (additional members) which need to be added to the owned members (the present property) are displayed. In addition, the cost saving effect due to the optimization may be displayed for the no-property-restriction optimization results (1) and (2).

The members which are used in the production are the feeders, the suction nozzles, a batch set-up changing wheeled table which changes a plurality of feeders at once, the tape reels, the component mounting machines, and the mounting heads. The restrictions of the selection range of the members to use in the production are restricted by the quantities of the members. Note that, the selection range of the feeders is not limited to selection of only the quantity of the tape feeders, and it may be possible to select both the types and the quantities of the feeders from among plural types of feeder (for example, a tape feeder, a bulk feeder, a stick feeder, a tray feeder, and the like). In a similar manner, the selection range of the suction nozzles is not limited to the selection of only the quantity of suction nozzles, for example, it may be possible to select both the types and the quantities of the suction nozzle from among plural types of suction nozzle with different nozzle diameters and suction pad shapes.

The intra present property optimization process and the no-property-restriction optimization process of the present example described above are executed as follows according to the production optimization process program of FIG. 3 by the optimization process computer 21. When the production optimization process program of FIG. 3 is started, first, in step 101, the present property (the members owned by the user at the present time) is confirmed, the process subsequently proceeds to step 102, and the intra present property optimization process of optimizing the production of the component mounting line 10 under conditions in which the selection range of the members to use in the production is restricted to within the range of the present property is executed.

Subsequently, the process proceeds to step 103, determines whether or not there are restrictions in the members which can presently be used, and, if it is determined that there are no restrictions in the members which can presently be used, the present program is ended in this state.

On the other hand, in step 103, if it is determined that there are restrictions in the members which can presently be used, the process proceeds to step 104, it is determined whether or not the no-property-restriction optimization process has been performed for all of the combinations of the members with usage restrictions by the processes of steps 105 and 106 described later, and, if it is determined that there are still no-property-restriction optimization processes which have not yet been executed, the process proceeds to step 105 and executes the no-property-restriction optimization process of optimizing the production of the component mounting line 10 under the conditions from which the restrictions of the selection range of the target members have been removed.

Subsequently, the process proceeds to step 106, and it is determined whether or not the production time of the no-property-restriction optimization results is shorter than the production time of the intra present property optimization results which are obtained by the process of step 102. As a result, if it is determined that the production time of the no-property-restriction optimization results is shorter than the production time of the intra present property optimization results, the process proceeds to step 107, the no-property-restriction optimization results are displayed on the display device 23 compared to the intra present property optimization results, and the process returns to step 104.

In step 106, when it is determined that the production time of the no-property-restriction optimization results is greater than or equal to the production time of the intra present property optimization results, since the productivity of the no-property-restriction optimization results is lower than that of the intra present property optimization results, the process proceeds to step 104 without displaying the no-property-restriction optimization results on the display device 23.

According to the processes described above, the restrictions of the selection range of the target members are removed, the no-property-restriction optimization process is repeated, and the no-property-restriction optimization process is executed for all combinations of the members with usage restrictions, at this time, step 104 is determined to be "yes", and the present program is ended.

According to the present example described above, the intra present property optimization process of optimizing the component mounting line 10 under conditions in which the selection range of the members to use in the production is restricted to within the range of members owned by the user (present property), and the no-property-restriction optimization process of optimizing the component mounting line 10 under conditions in which the restrictions of the selection range of the members to use in the production are removed for at least a subset of the members are executed, and since the intra present property optimization results are displayed on the display device 23 compared with the no-property-restriction optimization results, the worker can easily evaluate the investment cost and the productivity by comparing the intra present property optimization results and the no-property-restriction optimization results which are displayed on the display device 23, and it is possible to simplify the work of searching for appropriate settings of the members achieving both inexpensive investment cost and productivity.

Note that, the optimization results displayed on the display device 23 may be at least a subset of the total production time, the cycle time, the number of set-up changes, the total set-up changing time, the total production time increase/decrease effect, the additional members, and the cost reduction effect, that is, data which serves as an index for evaluating the productivity and investment cost may be displayed.

In addition, the disclosure is not limited to the example described above, for example, the configuration of the component mounting line 10 may be updated, the production optimization process program of FIG. 3 may be executed by a host computer for production management of the component mounting line 10 or the like, and it goes without saying that it is possible to embody the disclosure by making various changes within a scope that does not depart from the gist.

REFERENCE SIGNS LIST

10 . . . component mounting line, 11 . . . circuit board, 12 . . . conveyance path, 16 . . . feeder, 18 . . .

component mounting machine, 20 . . . production optimization device, 21 optimization process computer (intra present property optimization device, no-property-restriction optimization device), 23 display device (display device)

The invention claimed is:

1. A production optimization device of a component mounting line in which components are mounted on a circuit board using component mounting machines, comprising:
    a first optimization device to optimize production of the component mounting line under conditions in which a selection range of members to use in the production is restricted to within a range of members present to the component mounting line;
    a second optimization device to optimize the production of the component mounting line under conditions in which restriction of the selection range of the members to use in the production is removed for at least a subset of the members; and
    display device for displaying optimization results of the first optimization device and optimization results of the second optimization device.

2. The production optimization device of the component mounting line according to claim 1,
    wherein the second optimization device obtains a plurality of the optimization results by executing a plurality of optimization processes under a plurality of different conditions.

3. The production optimization device of the component mounting line according to claim 1,
    wherein the display device displays at least one of a total production time, a cycle time, a number of set-up changes, and a total set-up changing time, respectively, as the optimization results of the first optimization device and the optimization results of the second optimization device.

4. The production optimization device of the component mounting line according to claim 1,
    wherein the display device displays names and quantities of members which need to be added to the owned members as the optimization results of the second optimization device.

5. The production optimization device of the component mounting line according to claim 1,
    wherein the display device displays a cost reduction effect due to the optimization as the optimization results of the second optimization device.

6. The production optimization device of the component mounting line according to claim 1,
    wherein the members to use in the production are at least one of a feeder, a suction nozzle, a batch set-up changing wheeled table, a tape reel, a component mounting machine, and a mounting head.

7. The production optimization device of the component mounting line according to claim 1,
    wherein the restriction of the selection range of the members to use in the production is restricted by a quantity of the members.

8. The production optimization device of the component mounting line according to claim 1, wherein the members are component feeders of the component mounting line.

9. The production optimization device of the component mounting line according to claim 1, wherein the first and second optimization device each optimize a cycle time of the component mounting line.

* * * * *